US006177696B1

(12) United States Patent
Bronner et al.

(10) Patent No.: US 6,177,696 B1
(45) Date of Patent: Jan. 23, 2001

(54) INTEGRATION SCHEME ENHANCING DEEP TRENCH CAPACITANCE IN SEMICONDUCTOR INTEGRATED CIRCUIT DEVICES

(75) Inventors: Gary B. Bronner, Stormville; Laertis Economikos, Wappingers Falls; Rajarao Jammy, Wappingers Falls; Byeongju Park, Wappingers Falls; Carl J. Radens, LaGrangeville, all of NY (US); Martin E. Schrems, Saxony (DE)

(73) Assignees: International Business Machines Corporation, Armonk, NY (US); Infineon Technologies North America Corp., San Jose, CA (US)

( * ) Notice: Under 35 U.S.C. 154(b), the term of this patent shall be extended for 0 days.

(21) Appl. No.: 09/133,203

(22) Filed: Aug. 13, 1998

(51) Int. Cl.$^7$ ...................................................... H01L 29/72
(52) U.S. Cl. ............................ 257/301; 257/309; 257/68; 257/532

(58) Field of Search .................................. 257/301, 309, 257/532, 68

(56) References Cited

U.S. PATENT DOCUMENTS

| 5,191,509 | * | 3/1993 | Wen ........................................ 257/301 |
| 5,429,972 | | 7/1995 | Anjum et al. . |
| 5,444,013 | * | 8/1995 | Akrum et al. ........................ 257/301 |
| 5,595,926 | | 1/1997 | Tseng . |
| 5,665,622 | | 9/1997 | Muller et al. . |

* cited by examiner

Primary Examiner—Edward Wojciechowicz
(74) Attorney, Agent, or Firm—Ratner & Prestia; Steven Capella, Esq.

(57) ABSTRACT

A trench capacitor structure suitable for use in a semiconductor integrated circuit device and the process sequence used to form the structure. The trench capacitor provides increased capacitance by including a capacitor plate consisting of textured, hemispherical-grained silicon. The trench capacitor also includes a buried plate to reduce depletion of stored charge from the capacitor.

33 Claims, 8 Drawing Sheets

INTEGRATION SCHEME ENHANCING DEEP TRENCH CAPACITANCE IN SEMICONDUCTOR INTEGRATED CIRCUIT DEVICES

TECHNICAL FIELD

The present invention relates generally to semiconductor integrated circuit devices and, more specifically, to deep trench (DT) capacitors formed within an integrated circuit. The present invention also relates to the method for producing such deep trench capacitors within a semiconductor integrated circuit.

BACKGROUND OF THE INVENTION

Semiconductor integrated circuit memory devices store memory in the form of charge stored on a capacitor. The increases in integration density achieved in integrated circuits in recent years have been somewhat limited by the amount of charge which can be stored in capacitors within a given surface area. To meet the needs of increased integration, the amount of charge stored within a given surface area of a semiconductor integrated circuit device must be increased.

To increase the amount of charge stored by capacitors within a fixed surface area in a memory cell, the options are: (1) reduce the dielectric thickness, (2) increase the dielectric constant by changing to a different dielectric material, or (3) increase the surface area of the capacitor. The first option, reducing the thickness of the dielectric layer, results in increased leakage currents which can reduce the memory retention performance and adversely impact the reliability of the device. Changes to alternate dielectric materials require significant process development, new integration schemes, and new technology with a significant impact on the cost of production. Thus, the third option of increasing the surface area of the capacitor is the most desirable way to increase the amount of charge stored within a given surface area.

Trench capacitors have gained in popularity in recent years; they provide a structure that dramatically increases the amount of charge stored per semiconductor substrate surface area. As the depth of the trench increases, so, too, does the amount of charge stored within a fixed surface area. The technique of increasing the capacitor area for a trench capacitor by creating deeper trenches is limited, however, by manufacturing costs associated with the silicon etch processes involved in deep trench formation.

The technique is also limited by the processing technologies available for forming a capacitor within the deep trench once the trench is formed. As the aspect ratio of a trench capacitor increases (the depth of the trench increases relative to the width), it becomes increasingly difficult to form a capacitor within the trench. Formation of the capacitor within the trench generally requires manufacturing a plate within the trench, adding a dielectric within the trench, and then adding another plate within the trench. The inability to control the processes required to produce such structures within a trench is exacerbated as critical dimensions shrink. In addition, such processes further complicate the implementation of using deeper trenches to increase capacitance.

The prior art provides methods for forming a deep trench capacitor. An attractive method for increasing the amount of charge stored within a given size trench, and also the memory stored, involves the use of a capacitor plate or plates which contain textured surfaces. A textured surface increases the amount of exposed, effective charge-storing area within a given cross-sectional area. Thus, it is desirable to produce a capacitor in which the depth of the trench is maximized and the texture of the capacitor plate on which the dielectric is deposited, is also maximized. The ability to manufacture such a trench capacitor is limited by the processing technology available, as described above.

The ability to store charge is compromised when the charge stored is depleted because of the physical structure of the capacitor in which it is stored. As processing complexities in integration increase the need to incorporate a greater charge-storing capacity within a given surface area, it becomes increasingly more important to minimize the amount of charge depleted when being stored within a capacitor.

As device sizes and critical dimensions shrink and advances are made in device integration, associated advances in processing technology must also be made. In the semiconductor industry, the advances made in device integration are limited by the processing technology available to produce these devices. Therefore, it is an object of the present invention to provide associated manufacturing processes which are capable of producing the newly designed structure required by advanced integration. This object applies both to individual processes and to the process sequence used. The current art is limited by the processing technology available to create the devices required within the advanced integration scheme.

SUMMARY OF THE INVENTION

To achieve this and other objects, and in view of its purposes, the present invention provides an improvement to the existing deep trench capacitor technology existing in current art. The improvement consists of increasing the effective capacitor plate area for a given trench size, and incorporating a buried plate to minimize charge depletion. The present invention also provides a reliable and repeatable process sequence for producing these deep trench capacitors.

Specifically, the present invention involves the fabrication of a deep trench capacitor device wherein one of the capacitor plates is formed of hemispherical-grained silicon. The hemispherical-grained silicon is formed from an amorphous silicon film which is deposited onto the substrate and into the trench. One of the electrode plates of the capacitor is formed from a portion of the hemispherical-grained silicon film together with a "buried plate." The buried plate is formed by doping the semiconductor material forming the wall around the trench. The portion of the hemispherical-grained silicon film in contact with the buried plate is doped with the same impurity type as is the buried plate. Together, the doped portion of the hemispherical-grained silicon and the buried plate combine to form one plate of the capacitor.

The present invention also includes a dielectric node material in the trench. The dielectric material covers at least a portion of the hemispherical-grained silicon and buried plate. A conductive material fills the trench to form a second plate of the capacitor so that the dielectric material is disposed between the first plate of the capacitor and the second plate of the capacitor.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The Deep Trench Capacitor Device

Figure 1:
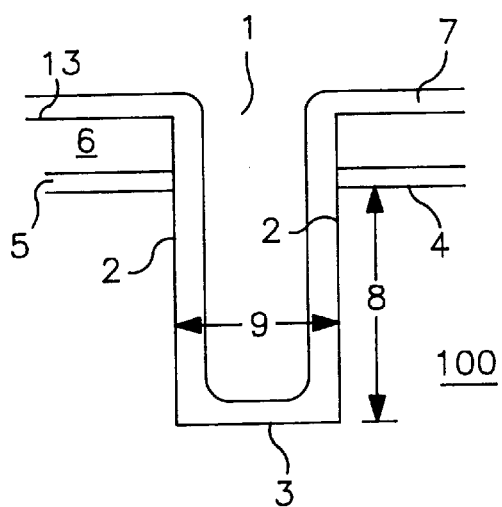
FIG. 1 is a cross section of a deep trench formed within a semiconductor substrate used as the starting point for a process according to the present invention.

Referring now to the drawing, wherein like reference numerals refer to like elements throughout, FIG. 1 shows a cross section of a deep trench 1 formed within a structure including a semiconductor substrate 100 with a top surface 4. A pad oxide film 5 and a pad nitride film 6 (typically silicon nitride) are deposited on top surface 4. In the preferred embodiment, the semiconductor substrate 100 may be a silicon substrate. The deep trench 1 cuts through the films 4 and 5 and into the semiconductor substrate 100.

The deep trench 1 includes sidewalls 2 and a trench bottom 3. The trench 1 is further defined by a trench depth 8 which is the distance from the top surface 4 of the semiconductor substrate 100 to the trench bottom 3, and a width 9. In a preferred embodiment, the depth 8 may exceed the width by at least twenty-five times. Also in the preferred embodiment, the depth 8 may be about six microns and the width may be about 0.175 microns.

An arsenosilicate glass (ASG) film 7 is formed on top of the structure, currently defined by the top surface 13 of the pad nitride film 6, and also on the sidewalls 2 of the deep trench 1. The ASG film 7 is formed using TEOS (tetraethyl orthosilicate) and triethylarsenate. The ASG film 7 is an arsenic (As) doped oxide. In a preferred embodiment, the process conditions for forming the ASG film 7 may be defined by a temperature of 650° C. at a pressure of 1 Torr in an LPCVD (low pressure chemical vapor deposition) batch furnace. The thickness of the ASG film 7 is preferably between 500 and 1000 Å. The ASG film 7 will later function as a source of the conductive species (arsenic), which will be used to dope the trench sidewalls 2 to form a buried plate.

Figure 2:
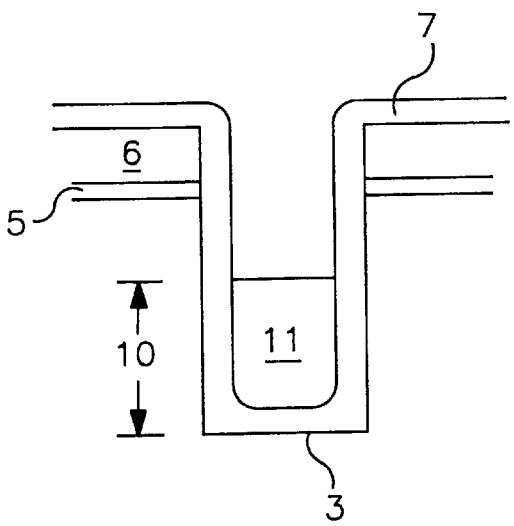
FIG. 2 is a cross section of the deep trench of FIG. 1 after the next step in a process sequence according to the present invention.

FIG. 2 is a cross section depicting the following step in the processing sequence. A photoresist film 11 has been applied to the semiconductor substrate 100 and recessed to a depth 10 above the trench bottom 3. Any suitable photoresist film common in the semiconductor industry may be used, as may be any suitable method for applying the photoresist film to the semiconductor substrate 100. The method for recessing the photoresist film 11 within the trench 1 may be CDE (chemical downstream etching) in the preferred embodiment, but any suitable method common to the art may be used. With the photoresist film 11 in place, a portion of the ASG film 7 may be selectively removed using an etching process. In a preferred embodiment, a 40:1 solution of BHF (buffered hydrofluoric acid in a solution of forty parts water to one part hydrofluoric acid) may be used to remove the exposed portion of the ASG film 7.

Figure 3:
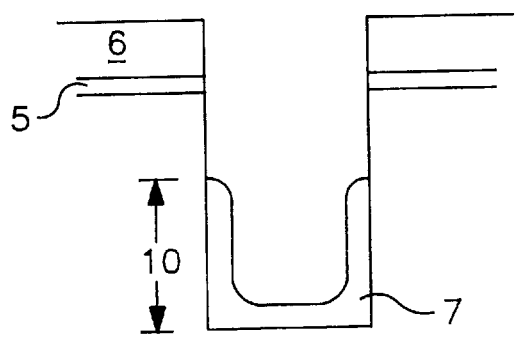
FIG. 3 is a cross section of the deep trench of FIG. 2 after the next step in a process sequence according to the present invention.

FIG. 3 shows the structure after only a portion of the original ASG film 7 remains; the other portion having been removed by the etching process. FIG. 3 also shows the structure after the photoresist film 11 (shown in FIG. 2) has been removed. Any photoresist removal procedure common to the industry may be used to remove the photoresist film 11. A plasma strip process may be used in the preferred embodiment.

Figure 4:
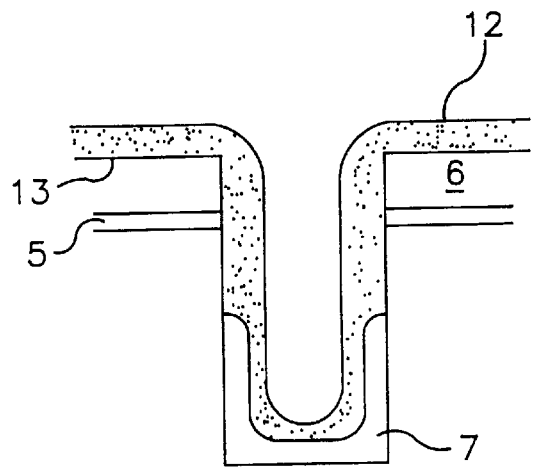
FIG. 4 is a cross section of the deep trench of FIG. 3 after the next step in a process sequence according to the present invention.

FIG. 4 shows the next step in the processing sequence. A TEOS (tetraethyl orthosilicate) film 12 is deposited on the structure. The TEOS film both covers the top of the structure, which at this point in the process sequence is the top surface 13 of the pad nitride film 6, and covers the sidewalls of the trench 1. The TEOS deposition may occur by either an LPCVD or PECVD (plasma enhanced chemical vapor deposition) process. This oxide film serves as a capping layer to prevent out diffusion of the arsenic from the ASG film 7 in subsequent processes. In a preferred embodiment, the thickness of the TEOS film 12 may be between 400 and 800 Å.

Figure 5:
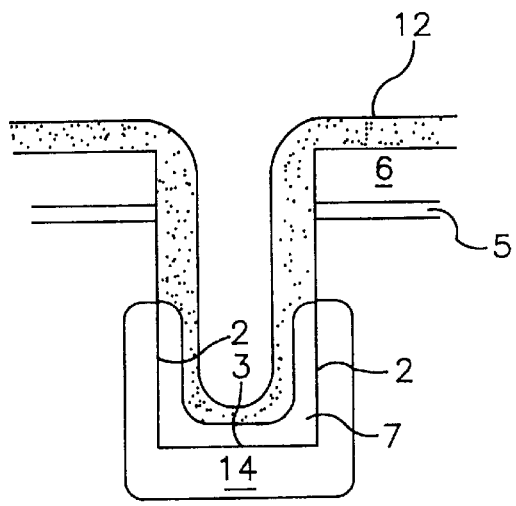
FIG. 5 is a cross section of the deep trench of FIG. 4 after the next step in a process sequence according to the present invention.

FIG. 5 shows the buried plate 14 formed from arsenic diffusion from the portion of the ASG film 7 which had remained after a portion of it was selectively removed. The $n^+$ doped buried plate 14 is formed below the trench bottom 3 and about portions of the sidewalls 2 of the trench 1. In one embodiment, the conditions for creating the buried plate 14 may be defined by a temperature of 1050° C. for two to thirty minutes in an inert environment. In the preferred embodiment, the process conditions for forming the buried plate may include a two-step process, whereby the first step is a two-minute furnace treatment at 1050° C. in an inert environment such as argon, followed by a ten-minute heat treatment at 950° C. in a dry oxygen environment.

Figure 6:
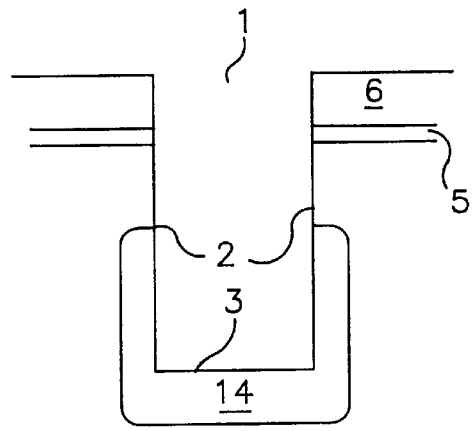
FIG. 6 is a cross section of the deep trench of FIG. 5 after the next step in a process sequence according to the present invention.

In FIG. 6, the deep trench 1 with sidewalls 2 and trench bottom 3 is shown formed within the semiconductor substrate 100 which now includes a buried plate 14 formed around the trench 1. The trench 1, as depicted in FIG. 6, is produced by removing both the ASG film 7 and the TEOS film 12 from the structure. In a preferred embodiment, both films are removed simultaneously by etching in a BHF 40:1 solution.

Figure 7:
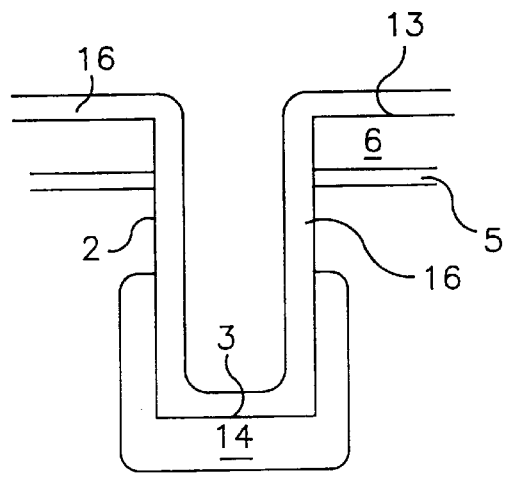
FIG. 7 is a cross section of the deep trench of FIG. 6 after the next step in the process sequence according to the present invention.

FIG. 7 shows the structure with an amorphous silicon film (α-Si) film 16 formed on the structure. The amorphous silicon film 16 is formed on the sidewalls 2 of the deep trench 1, the trench bottom 3, and the top surface 13 of the current structure. In a preferred embodiment, the thickness of the amorphous silicon film 16 may be between 100 and 200 Å. The conditions for forming the amorphous silicon film 16 on the semiconductor substrate 100 in an LPCVD batch reactor may be at 500° C. and 200 millitorr. The amorphous silicon film 16 may be doped or undoped upon deposition; it may be doped after deposition. Any suitable doping method common to the art may be used, such as gas phase doping, H-free gas phase doping (where a carrier gas other than hydrogen is used), or plasma doping. In an exemplary embodiment, gas phase doping may include arsine, phosphine, or diborane. In an alternative embodiment, a portion of the amorphous silicon film 16 may be formed on the surfaces initially, then doped by a suitable doping method, then the remaining portion of the film may be added to form the amorphous silicon film 16.

Figure 8:
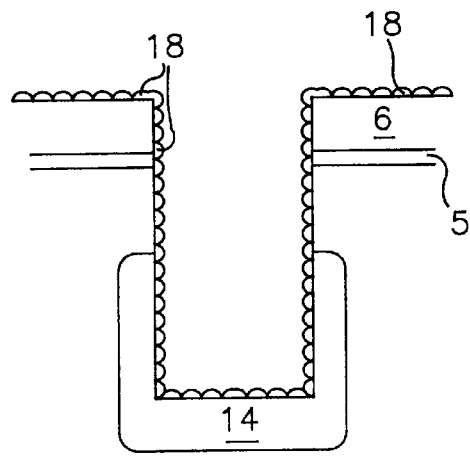
FIG. 8 is a cross section of the deep trench of FIG. 7 after the next step in a process sequence according to the present invention.

FIG. 8 shows the structure after the amorphous silicon film 16 has been converted into hemispherical-grained silicon (HSG) film 18. A preferred process for forming HSG film 18 from the amorphous silicon film 16 may be by seeding the amorphous silicon film 16 with silane ($SiH_4$) and then annealing. In a preferred embodiment, the process sequence may include forming nucleation sites by depositing silane using an LPCVD process. A vapor containing silane diluted with helium may be introduced at 550 to 560° C. to form nucleation sites upon the amorphous silicon film 16. The nucleation sites are then annealed to crystallize the amorphous silicon film 16 into the HSG film 18. The annealing process is carried out at ultra high vacuum.

After the formation of the HSG film 18, a cleaning and etching process may be used to increase the space between the grains. Another option at this point in the process sequence is to dope the HSG film 18 by plasma doping, gas phase doping, H-free gas phase doping, or to simply soak the HSG film 18 in arsine ($AsH_3$) followed by a heat treatment to drive the arsenic from the arsine source into the HSG film 18. In the preferred embodiment, the heat treatment may take place at 620° C. The option of doping the film at the current process point may not be necessary if the film was doped as amorphous silicon before the amorphous silicon was converted into HSG.

Figure 9:
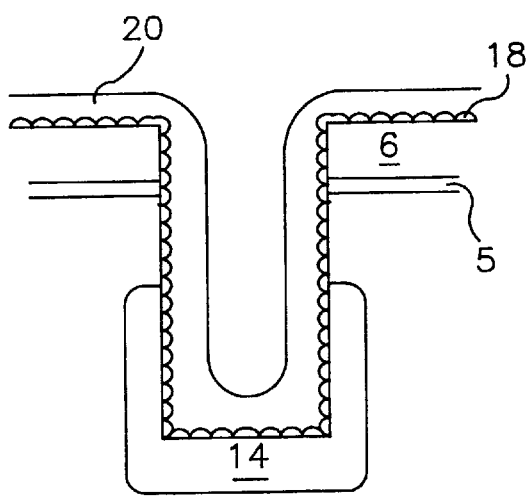
FIG. 9 is a cross section of the deep trench of FIG. 8 after the next step in a process sequence according to the present invention.

FIG. 9 shows a silicon nitride film 20 deposited over the HSG film 18 both on the top surface 13 and within the trench 1. The silicon nitride film 20 will be used as a mask in subsequent processing to determine the location of oxide growth within the trench 1. A preferred process for depositing the silicon nitride film 20 may be an LPCVD process at 770° C. and 200 millitorr.

Figure 10:
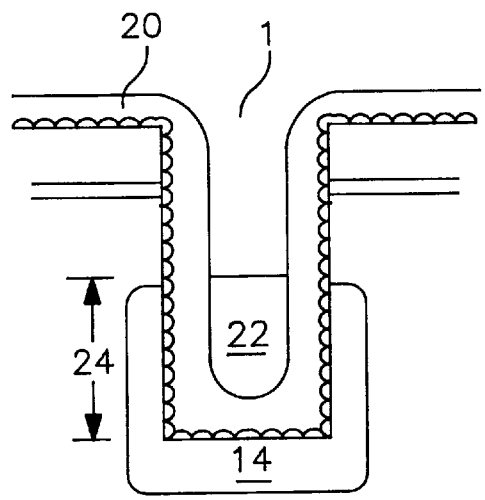
FIG. 10 is a cross section of the deep trench of FIG. 9 after the next step in a process sequence according to the present invention.

FIG. 10 shows the structure with a photoresist film 22 deposited and recessed within the trench 1 at a depth 24. As previously, any photoresist film common to the art, and any suitable method for applying the film, may be used. In the preferred embodiment, CDE processing may be used to recess the photoresist film 22 to depth 24.

Figure 11:
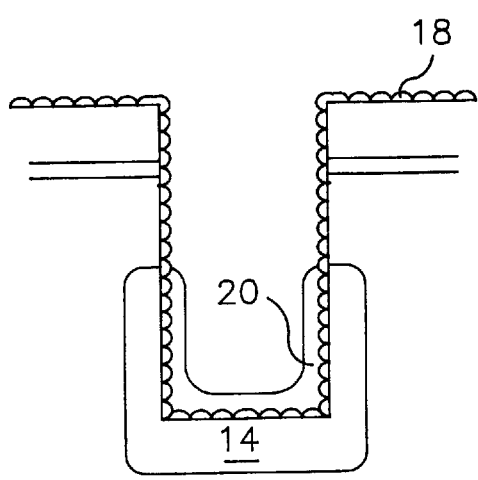
FIG. 11 is a cross section of the deep trench of FIG. 10 after the next step in a process sequence according to the present invention.

FIG. 11 shows the structure after the photoresist film 22 has been used as a photomask during the etching of the silicon nitride film 20. After etching, only a portion of the silicon nitride film 20 remains. In the preferred embodiment, the method for etching the silicon nitride film 20 may include the application of hot phosphoric acid at 160–165° C., but any suitable method for removing silicon nitride may be used. After the silicon nitride film 20 is etched to leave only a portion of the silicon nitride film 20 within the trench 1, the photoresist film 22 is removed from the trench 1. Any suitable method for photoresist removal may be used, such as plasma stripping in the preferred embodiment.

Figure 12:
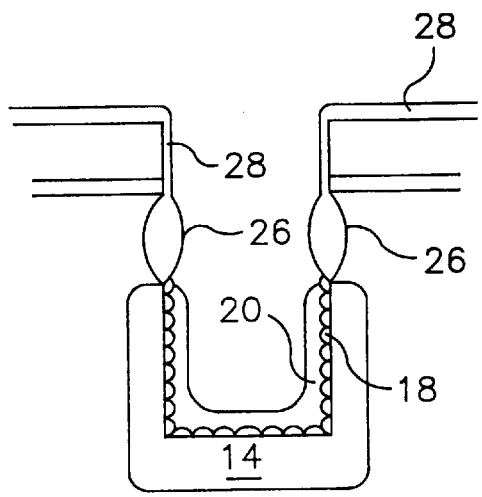
FIG. 12 is a cross section of the deep trench of FIG. 11 after the next step in a process sequence according to the present invention.

FIG. 12 shows the structure after an oxide film 26 and 28 has been formed from the exposed HSG which is not protected by the silicon nitride film 20. Within the trench 1, a collar oxide 26 film is formed from the exposed HSG film and the semiconductor material from the sidewalls 2 of the trench 1. A thin oxide 28 is also formed from the other exposed areas of the HSG film 18. In a preferred embodiment, the process conditions may be 1050° C. in an oxygen environment, and the thickness of the collar oxide 26 may be 300 Å. During this process, some back diffusion of the arsenic from the buried plate 14 into the HSG film 18 may occur. Such back diffusion may be necessary if the HSG film 18 was not doped previously.

Figure 13:
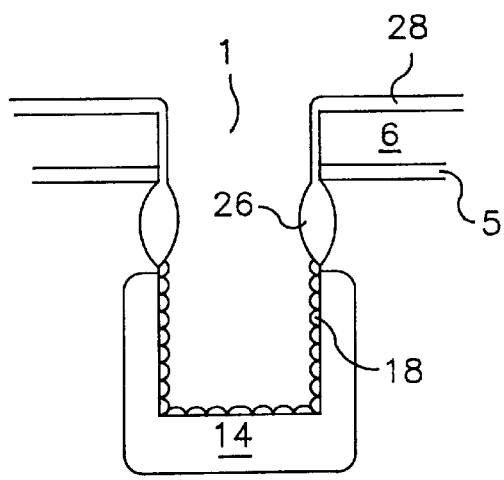
FIG. 13 is a cross section of the deep trench of FIG. 12 after the next step in a process sequence according to the present invention.

FIG. 13 shows the structure after the silicon nitride film 20 has been removed. Any suitable method for selectively removing the silicon nitride film 20 may be used. In the preferred embodiment, hot phosphoric acid at 160–165° C. may be used to remove the silicon nitride film 20.

Figure 14:
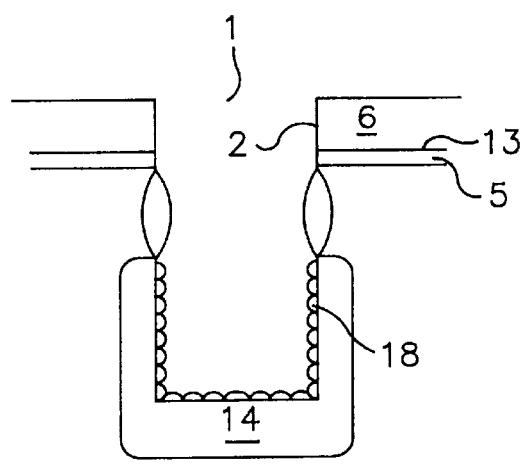
FIG. 14 is a cross section of the deep trench of FIG. 13 after the next step in a process sequence according to the present invention.

FIG. 14 shows the structure after the thin oxide film 28 has been removed from the top surface 13 of the structure and the part of the trench 1 where the collar oxide 26 has not been created. A buffered HF (hydrofluoric acid) or diluted HF solution may be used in the preferred embodiment to remove the oxide, but any method for oxide removal common to the semiconductor industry may be used.

Figure 15:
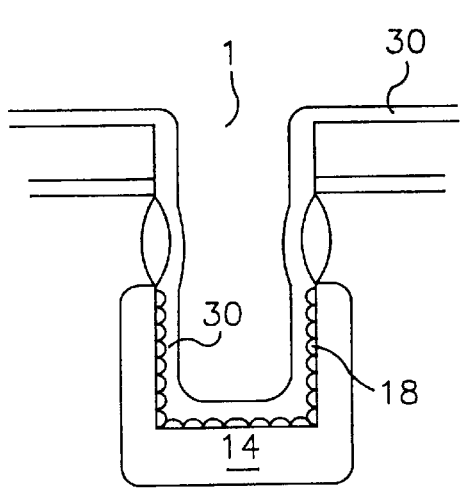
FIG. 15 is a cross section of the deep trench of FIG. 14 after the next step in a process sequence according to the present invention.

FIG. 15 shows the structure wherein a node silicon nitride film 30 has been formed on the structure and within the deep trench 1. The node silicon nitride film 30 may be formed by an LPCVD process. If the HSG film 18 has not yet been doped, the process conditions for the deposition of the node silicon nitride film 30 may be chosen to cause diffusion of the arsenic from the buried plate 14 into the HSG film 18. Alternatively, the node silicon nitride film 30 may be deposited using an LPCVD process at 770° C. and 200 millitorr, and a thermal step may follow to cause the arsenic diffusion from the buried plate 14 into the HSG film 18. This node silicon nitride film 30 will function as a dielectric of the deep trench capacitor, isolating the capacitor plates.

Figure 16:
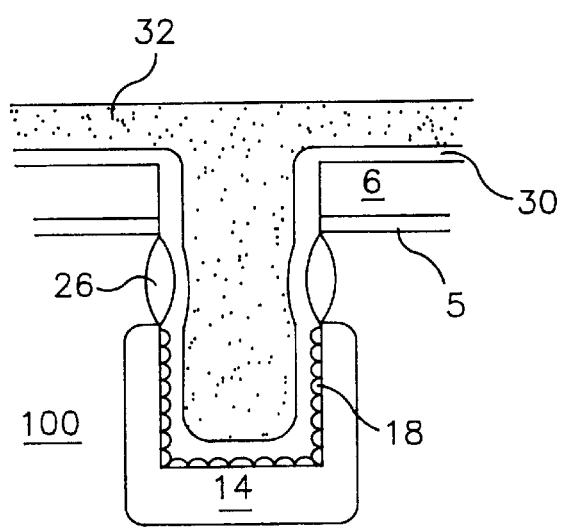
FIG. 16 is a cross section of the deep trench of FIG. 15 after the next step in a process sequence according to the present invention.

FIG. 16 shows the structure after an arsenic-doped polysilicon film 32 has been added to fill the trench 1 and create the other electrode of the capacitor. In a preferred embodiment, the formation of the arsenic-doped polysilicon film 32 may be done using alternate deposition and doping steps. The deposition steps include, in a preferred embodiment, an LPCVD process at 550° C. using silane to deposit an intrinsic polysilicon film on the structure. This deposition process is followed by soaking the structure in arsine. The process sequence is then repeated until the desired doping level is achieved. Then, the trench 1 is filled with intrinsic polysilicon to produce arsenic-doped polysilicon film 32. The heat provided in the subsequent deposition steps drives the arsenic throughout the film. In the preferred embodiment, the total film thickness may be 2,500 Å.

Figure 17:
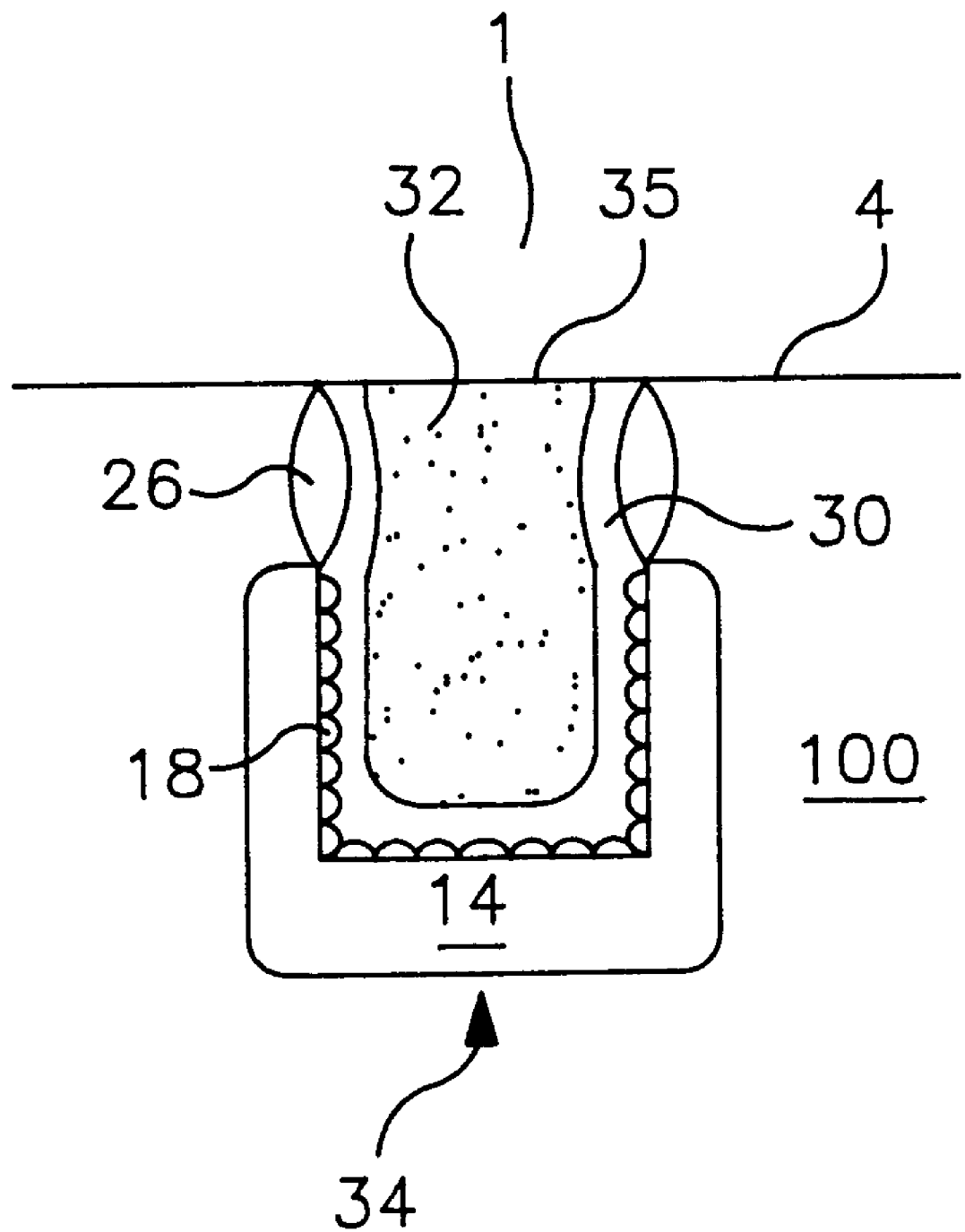
FIG. 17 is a cross section of the deep trench of FIG. 16 after the final step in a process sequence according to the present invention.

FIG. 17 shows the completed deep trench capacitor 34 of the present invention. The structure includes a first plate consisting of the buried plate 14 and the HSG film 18, both of which may be doped with the same material. The dielectric node material 30 isolates the first plate from the second plate formed of the arsenic-doped polysilicon film 32. FIG. 17 shows the structure after it has been polished down to the original top surface 4 of the silicon substrate 100. Any suitable method for polishing a semiconductor substrate, such as chemical mechanical polishing (CMP), may be used. In a preferred embodiment, the polishing process may consist of selective etch processes to remove portions of the structure which extend above the original semiconductor top surface 4, followed by chemical mechanical polishing to produce a device with an upper surface 35 which is substantially co-planar with the original semiconductor top surface 4.

FIGS. 18 through 26 are cross sections depicting a process used to form the deep trench capacitor of the present invention in an alternative embodiment. Features of this alternative embodiment include the formation of a collar oxide before the formation of the buried plate. In this fabrication sequence, the buried plate is later formed within the trench in the area not protected by the collar oxide. In addition, the HSG film is doped at the same time that the buried plate is formed: the dopant species dopes the HSG and penetrates through to simultaneously dope the sidewalls of the trench.

Figure 18:
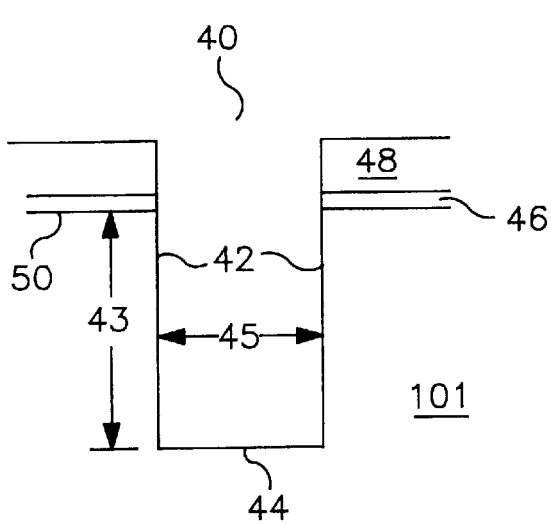
FIG. 18 is a cross section of a deep trench formed within a semiconductor substrate used as the starting point for an alternative embodiment of the process according to the present invention.

FIG. 18 shows a deep trench 40 within a semiconductor substrate 101. The deep trench 40 includes a trench bottom 44, sidewalls 42, a depth 43, and a width 45. The deep trench 40 is formed within a structure including a semiconductor substrate 101 which has a pad oxide film 46 formed on top of it and a pad silicon nitride film 48 formed on top of the pad oxide film 46. The semiconductor substrate 101 has a top surface 50. The trench dimensions and aspect ratio may be the same as stated with reference to the previous embodiment.

Figure 19:
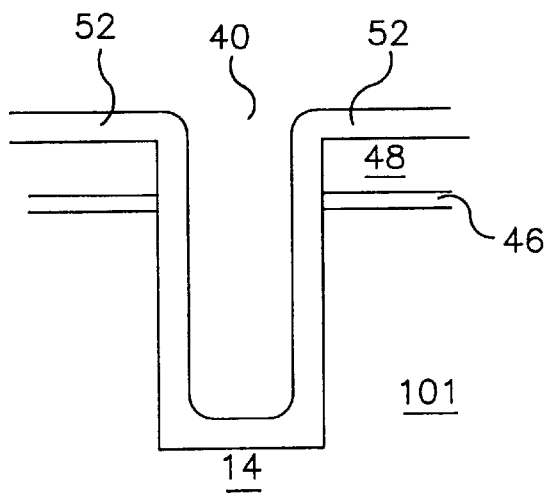
FIG. 19 is a cross section of the deep trench of FIG. 18 after the next step in the process sequence according to the alternative embodiment of the present invention.

FIG. 19 shows the structure after a silicon nitride film 52 has been formed on the structure and also within the trench 40. The silicon nitride film 52 will be used as a mask in subsequent processing to determine the location of oxide growth within the trench 40. A preferred process for forming the silicon nitride film 52 may be an LPCVD process at 770° C. and 200 millitorr.

Figure 20:
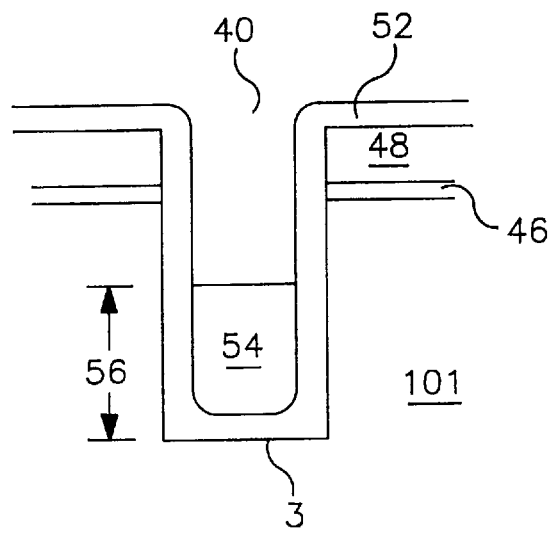
FIG. 20 is a cross section of the deep trench of FIG. 19 after the next step in the process sequence according to the alternative embodiment of the present invention.

FIG. 20 shows the structure after a photoresist film 54 has been applied and recessed to a depth 56 within the trench 40. The photoresist film 54 will be used to photomask the silicon nitride film 52 which will be subsequently etched in the areas in which it is exposed. Any suitable photoresist film and method for applying the film common to the art may be used. In the preferred embodiment, CDE processing may be used to recess the photoresist film 54 to depth 56 within the trench 40.

Figure 21:
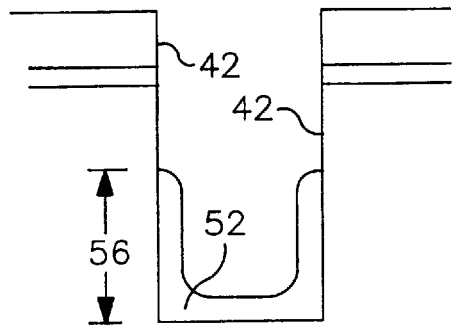
FIG. 21 is a cross section of the deep trench of FIG. 20 after the next step in the alternative embodiment of the process sequence according to the present invention.

FIG. 21 shows the structure after the silicon nitride film 52 has been selectively removed in the areas not protected by the photoresist film 54. After etching, only a portion of the original silicon nitride film 52 remains. A preferred method for removing silicon nitride may be hot phosphoric acid at 160–165° C., but any suitable method for selectively removing silicon nitride may be used. After selective removal, only a portion of the silicon nitride film 52 fills the trench 40 up to depth 56. The other areas of the sidewalls 42 of the trench 40 are exposed. The photoresist film 54 (as shown in FIG. 20) has been removed. Any method suitable to the art may be used to remove the photoresist film 54 from within the trench 40. In the preferred embodiment, plasma stripping may be used.

Figure 22:
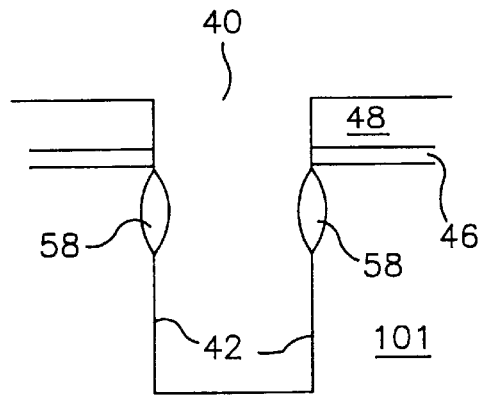
FIG. 22 is a cross section of the deep trench of FIG. 21 after the next step in the process sequence according to the alternative embodiment of the present invention.

FIG. 22 shows the structure after a collar oxide 58 has been formed. The collar oxide 58 is formed by oxidizing the structure of FIG. 21. No oxide is formed in the areas of the trench 40 protected by the silicon nitride film 52 (shown in FIG. 21). A portion of the semiconductor substrate 101 exposed along the sidewalls 42 is consumed to produce the collar oxide 58. Typical process conditions for formation of the collar oxide 58 may be to heat the semiconductor substrate to 1050° C. in an oxygen environment, but any suitable method of oxidation may be used. After the collar oxide 58 is formed, the silicon nitride film 52 is removed. In the preferred embodiment, hot phosphoric acid at 160–165° C. may be used to remove the silicon nitride film 52, but any suitable method may be used.

Figure 23:
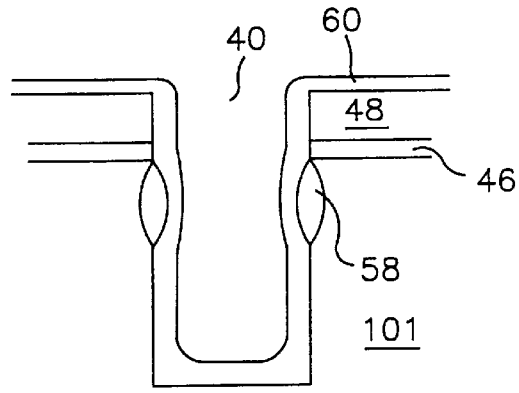
FIG. 23 is a cross section of the deep trench of FIG. 22 after the next step in the process sequence according to the alternative embodiment of the present invention.

Turning to FIG. 23, the structure now includes an amorphous silicon film 60 deposited on top of the structure and also within the trench 40. The typical thickness of the amorphous silicon film 60 may be 100 to 200 Å and, in a preferred embodiment, the deposition of the film may take place in an LPCVD batch reactor at a temperature of 500° C. and a pressure of 200 millitorr.

Figure 24:
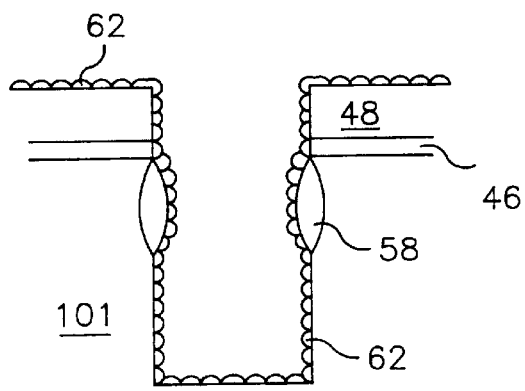
FIG. 24 is a cross section of the deep trench of FIG. 23 after the next step in the process sequence according to the alternative embodiment of the present invention.

FIG. 24 shows the structure after the amorphous silicon film 60 has been converted into an hemispherical-grained silicon (HSG) film 62. The formation of the HSG film 62 from the amorphous silicon film 60 is similar to the process described in conjunction with FIG. 8 of the previous embodiment.

Figure 25:
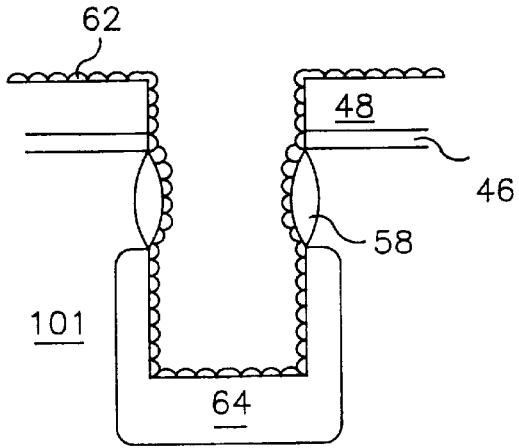
FIG. 25 is a cross section of the deep trench of FIG. 24 after the next step in the process sequence according to the alternative embodiment of the present invention.

FIG. 25 shows the structure after a buried plate 64 has been added. The buried plate 64 is formed by doping the structure. Typical doping processes include plasma doping, plasma immersion, or H-free gas phase doping. The doping process will dope both the HSG film 62 and the portion of the trench 40 not protected by the collar oxide 58. In this embodiment, the buried plate 64 and the HSG film 62 which contacts the buried plate 64 are simultaneously doped with the same species. Together, they form one plate of the trench capacitor.

Figure 26:
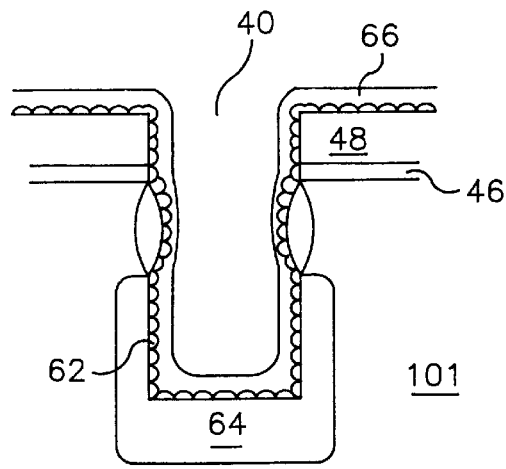
FIG. 26 is a cross section of the deep trench of FIG. 25 after the next step in the process sequence according to the alternative embodiment of the present invention.

FIG. 26 shows the structure after a conformal node silicon nitride dielectric film 66 has been formed on it. An LPCVD process is typically used to deposit the node silicon nitride dielectric film 66. The node silicon nitride dielectric film 66 will serve as the dielectric in the capacitor. As pictured, the device in FIG. 26 includes a first plate consisting of the buried plate 64 and the portion of the HSG film 62 which contacts the buried plate 64. The capacitor dielectric appears as the node silicon nitride dielectric film 66.

Figure 27:
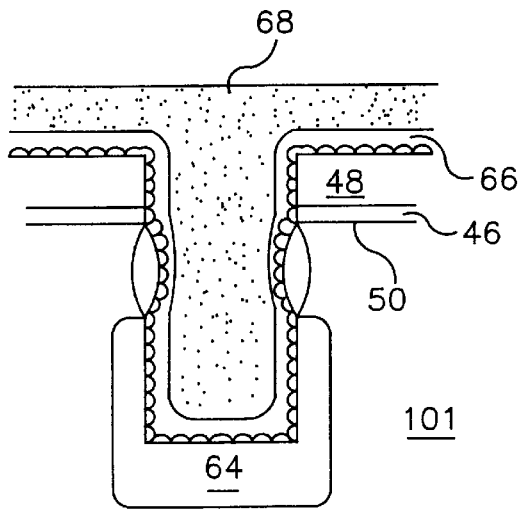
FIG. 27 is a cross section of the deep trench of FIG. 26 after the next step in the process sequence according to the alternative embodiment of the present invention.

FIG. 27 shows the structure after an arsenic-doped polysilicon film 68 has been added to fill the trench 40 and create the other electrode of the capacitor. In a preferred embodiment, the formation of the arsenic-doped polysilicon film 68 may be done using alternate deposition and doping steps. The deposition steps include, in a preferred embodiment, an LPCVD process at 550° C. using silane to form an intrinsic polysilicon film on the structure. This deposition process is followed by soaking the structure in arsine. The process sequence is then repeated until the desired doping level is achieved. Then, the trench 40 is filled with intrinsic polysilicon to produce arsenic-doped polysilicon film 68. In the preferred embodiment, the total film thickness may be 2,500 Å.

Figure 28:
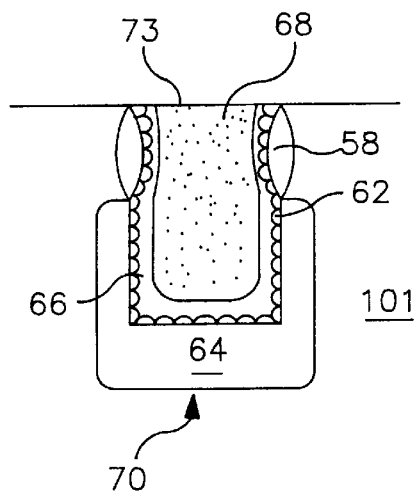
FIG. 28 is a cross section of the deep trench of FIG. 27 after the final step in the process sequence according to the alternative embodiment of the present invention.

FIG. 28 shows the completed deep trench capacitor 70. The structure includes a first plate consisting of the buried plate 64 and the HSG film 62. The node silicon nitride dielectric film 66 isolates the first plate from the second plate formed of the arsenic-doped polysilicon film 68. FIG. 28 shows the structure after it has been polished down to the original substrate top surface 50. The polishing methods are described in conjunction with FIG. 17 of the previous embodiment. The completed structure includes an upper surface 73 which is substantially coplanar with the original semiconductor top surface 50.

The foregoing description of preferred embodiments of the invention has been presented for the purposes of illustrating and describing the main points and concepts of the invention. The present invention is not limited, however, to those embodiments. For example, alternate embodiments may include processing conditions which vary from the conditions detailed above, and may also include process films of thicknesses outside the range of those detailed above.

The present invention positively uses a buried plate and a hemispherical-grained silicon structure to form a first plate of a deep trench capacitor. The present invention maximizes the surface area for a capacitor plate within a given trench and minimizes the amount of charge depleted from the capacitor which normally occurs. The previous description has been presented to describe two embodiments of the present invention. Those skilled in the art will recognize, however, that the invention can be practiced with modifications within the spirit and scope of the appended claims.

What is claimed:

1. A trench structure for a trench capacitor, said trench structure comprising:

a semiconductor substrate having a trench wall, adjacent portions, and an opening bounded by the trench wall, a portion of the trench wall and adjacent portions of the semiconductor substrate doped with an electrically conductive species to form a buried plate of silicon, and a textured silicon film along a section of said trench wall, at least part of said textured silicon film contacting said buried plate and combining therewith to form a capacitor plate.

2. The trench structure of claim 1 wherein said textured silicon comprises hemispherical-grained silicon.

3. The trench structure of claim 1 wherein the textured silicon film is doped with a species of the same charge type as said electrically conductive species.

4. A trench capacitor positioned in a semiconductor substrate having a trench wall, adjacent portions, and a trench bounded by the trench wall, said trench capacitor comprising:

a buried plate of silicon including a portion of the trench wall and adjacent portions of the semiconductor substrate doped with an electrically conductive species;

a hemispherical-grained silicon film formed along at least a portion of said trench wall, said film doped with an electrically conductive impurity and at least a portion of said hemispherical-grained silicon film contacting said buried plate to form a first plate of said trench capacitor;

a dielectric node material in said trench, said node material covering at least a portion of said hemispherical-grained silicon film; and a conductive material filling at least a portion of said trench, said conductive material forming a second plate of said trench capacitor;

wherein said dielectric node material is disposed between said first plate and said second plate.

5. The trench capacitor of claim 4 wherein said conductive material filling at least a portion of said trench comprises arsenic-doped polysilicon.

6. The trench capacitor of claim 4 further comprising a collar oxide formed about said trench wall electrically isolating said first plate.

7. A process of forming a trench capacitor in a semiconductor substrate, said process comprising:

providing a semiconductor substrate with a trench therein, said trench having a trench wall;

doping a portion of said semiconductor substrate about said trench wall with an electrically conductive species to form a buried plate;

depositing a layer of amorphous silicon in said trench on at least a portion of said trench wall;

heating said amorphous silicon whereby at least a portion of said amorphous silicon crystallizes as hemispherical-grained silicon on said trench wall, at least a portion of said hemispherical-grained silicon contacting at least part of said buried plate to form a first plate of said capacitor;

doping said hemispherical-grained silicon with said electrically conductive species, thereby converting said hemispherical-grained silicon to doped hemispherical-grained silicon;

forming a conformal dielectric node layer over at least a portion of said doped hemispherical-grained silicon; and covering said dielectric node layer with a conductive material to form a second plate of said capacitor.

8. The process of claim 7 further comprising the step of cleaning and etching said hemispherical-grained silicon.

9. The process of claim 8 wherein said step of cleaning and etching said hemispherical-grained silicon increases the grain spacing of said hemispherical-grained silicon.

10. The process of claim 7 wherein said step of doping said hemispherical-grained silicon comprises heating said substrate to cause a portion of said electrically conductive species in said buried plate to diffuse from said buried plate into said hemispherical-grained silicon.

11. The process of claim 7 wherein said step of doping said hemispherical-grained silicon comprises H-free gas phase doping.

12. The process of claim 7 wherein said step of doping said hemispherical-grained silicon comprises soaking in $AsH_3$.

13. The process of claim 12 further comprising heating said substrate to drive the arsenic of said $AsH_3$ into said hemispherical-grained silicon.

14. A process of forming a trench capacitor in a semiconductor substrate, said process comprising:
   providing a semiconductor substrate with a trench therein, said trench having a trench wall;
   doping a portion of said semiconductor substrate about said trench wall with an electrically conductive species to form a buried plate;
   depositing a layer of amorphous silicon in said trench on at least a portion of said trench wall;
   doping said layer of amorphous silicon with an impurity of a conductive species of the same charge type as said conductive species in said buried plate;
   heating said amorphous silicon whereby at least a portion of said amorphous silicon crystallizes as hemispherical-grained silicon on said trench wall, at least a portion of said hemispherical-grained silicon contacting at least part of said buried plate to form a first plate of said capacitor, said hemispherical-grained silicon therefore being doped upon formation;
   forming a conformal dielectric node layer over at least a portion of said doped hemispherical-grained silicon; and
   covering said dielectric node layer with a conductive material to form a second plate of said capacitor.

15. The process of claim 14 wherein said step of doping said amorphous silicon comprises plasma doping.

16. The process of claim 14 wherein said step of doping said amorphous silicon comprises gas phase doping.

17. The process of claim 14 wherein said step of depositing a layer of amorphous silicon comprises depositing a first amorphous silicon film; said step of doping said amorphous silicon comprises doping said first amorphous silicon film; and further comprising the step of depositing a second amorphous silicon film.

18. The process of claim 7 wherein said step of covering said dielectric node layer comprises substantially filling said trench with said conductive material.

19. The process of claim 7 further comprising the step of removing the portion of said hemispherical-grained silicon not contacting said buried plate.

20. The process of claim 7 wherein said step of doping a portion of said semiconductor substrate comprises depositing a film including arsenic along said trench wall; selectively removing a section of said film from said trench wall; and heating the substrate to urge said arsenic to diffuse from said film into said portion of said semiconductor substrate.

21. The process of claim 7 further comprising the step of selectively oxidizing a portion of said hemispherical-grained silicon on said trench wall to form an oxide film, said oxide film electrically isolating said first plate of said capacitor.

22. The process of claim 21 wherein the step of selectively oxidizing a portion of said hemispherical-grained silicon comprises:
   covering said hemispherical-grained silicon with a silicon nitride film;
   selectively removing a portion of said silicon nitride film from said trench wall to create an exposed portion of hemispherical-grained silicon on said trench wall;
   heating said substrate to oxidize said exposed portion of said hemispherical-grained silicon on said trench wall; and
   removing the remainder of the silicon nitride film from the trench wall.

23. The process of claim 7 wherein said conductive material is arsenic-doped polysilicon.

24. The process of claim 23 wherein said step of covering said dielectric node layer comprises alternatively depositing an intrinsic polysilicon film and doping said film.

25. The process of claim 24 wherein said step of depositing an intrinsic polysilicon film comprises low pressure chemical vapor deposition.

26. A process of forming a trench capacitor in a semiconductor substrate, said process comprising:
   providing a semiconductor substrate with a trench therein, said trench having a trench wall;
   depositing a layer of amorphous silicon in said trench on at least a portion of said trench wall;
   heating said amorphous silicon whereby at least a portion of said amorphous silicon crystallizes as hemispherical-grained silicon on said trench wall;
   doping a portion of said semiconductor substrate about said trench wall, and the corresponding section of said hemispherical-grained silicon in contact with said portion, with an electrically conductive species to form a buried plate within said trench wall and a doped section of said hemispherical-grained silicon, said buried plate and said doped section forming a first plate of said trench capacitor;
   forming a conformal dielectric node layer over at least a portion of said doped section of said hemispherical-grained silicon; and
   covering said dielectric node layer with a conductive material to form a second plate of said trench capacitor.

27. The process of claim 26 further comprising forming a collar oxide film about a portion of said trench wall prior to said step of depositing a layer of amorphous silicon in said trench.

28. The process of claim 27 wherein said conductive material comprises arsenic-doped polysilicon.

29. The process of claim 26 wherein said step of doping comprises plasma doping.

30. The process of claim 26 wherein said step of doping comprises plasma immersion.

31. The process of claim 26 wherein said step of doping comprises H-free gas phase doping.

32. The trench capacitor structure of claim 4 wherein said trench is defined by a depth and a width, said depth exceeding said width by a factor of 25 or greater.

33. The trench structure as in claim 1, wherein said trench opening extends downward from a substrate surface and said buried plate is receded below said substrate surface.

* * * * *